United States Patent
Kim et al.

(10) Patent No.: US 8,236,592 B2
(45) Date of Patent: Aug. 7, 2012

(54) METHOD OF FORMING SEMICONDUCTOR DEVICE

(75) Inventors: Ryoung-han Kim, San Jose, CA (US); Thomas Ingolf Wallow, San Carlos, CA (US); Harry Jay Levinson, Saratoga, CA (US); Jongwook Kye, Pleasanton, CA (US); Alden R. Acheta, Brentwood, CA (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 1044 days.

(21) Appl. No.: 11/623,031

(22) Filed: Jan. 12, 2007

(65) Prior Publication Data
US 2008/0171446 A1   Jul. 17, 2008

(51) Int. Cl.
*H01L 21/00* (2006.01)

(52) U.S. Cl. .................. 438/39; 438/759; 257/E21.536

(58) Field of Classification Search .................. 438/599; 257/E21.014, E21.015, E21.023, E21.036, 257/E21.234, E21.482, E21.483, E21.536
See application file for complete search history.

(56) References Cited

U.S. PATENT DOCUMENTS

| 5,830,624 | A | 11/1998 | Bae et al. |
| 5,989,788 | A | 11/1999 | Bae et al. |
| 6,015,650 | A | 1/2000 | Bae |
| 6,033,952 | A | 3/2000 | Yasumura et al. |
| 6,270,929 | B1 | 8/2001 | Lyons et al. |
| 6,319,655 | B1 | 11/2001 | Wong et al. |
| 6,358,670 | B1 | 3/2002 | Wong et al. |
| 6,383,952 | B1 | 5/2002 | Subramanian et al. |
| 6,811,817 | B2 | 11/2004 | Sugeta et al. |
| 6,866,986 | B2 | 3/2005 | Chun et al. |
| 6,905,975 | B2 | 6/2005 | Boettiger et al. |
| 2005/0000936 | A1* | 1/2005 | Boettiger et al. ............... 216/41 |
| 2005/0070095 | A1* | 3/2005 | Sharan et al. ................. 438/642 |
| 2005/0130068 | A1* | 6/2005 | Kondoh et al. ............... 430/312 |
| 2005/0221528 | A1* | 10/2005 | Bruner ........................... 438/50 |
| 2006/0160028 | A1* | 7/2006 | Lee et al. ..................... 430/312 |

FOREIGN PATENT DOCUMENTS
WO   2008/059440   5/2008

* cited by examiner

*Primary Examiner* — Cheung Lee
(74) *Attorney, Agent, or Firm* — Farjami & Farjami LLP

(57) ABSTRACT

A method for forming a semiconductor device is provided including processing a wafer having a target material; forming a first pattern over the target material; forming a protection layer over the first pattern; and forming a second pattern, over the target material and not over the protection layer, without an etching step between the forming the first pattern and the forming the second pattern.

20 Claims, 3 Drawing Sheets

METHOD OF FORMING SEMICONDUCTOR DEVICE

CROSS-REFERENCE TO RELATED APPLICATION

The present application contains subject matter related to a concurrently filed U.S. patent application by Thomas L. Wallow, Ryoung-han Kim, Jongwook Kye, and Harry Levinson entitled "Method of Forming Semiconductor Device with Multiple Level Patterning". The related application Ser. No. 11/623,036 is assigned to Advanced Micro Devices, Inc.

TECHNICAL FIELD

The present invention relates generally to a semiconductor device, and more particularly to a manufacturing method of a semiconductor device.

BACKGROUND ART

Modern electronics, such as smart phones, personal digital assistants, location based services devices, digital cameras, music players, servers, and storage arrays, are packing more semiconductor devices into an ever-shrinking physical space with expectations for decreasing cost. One cornerstone for devices to continue proliferation into everyday life is the integration of more functions into a given area of the semiconductor device. Numerous technologies have been developed to meet these requirements.

One approach to increase the density in a semiconductor device involves a technology to transform and shrink images onto a wafer. This process is called lithography or photolithography. Lithography systems have limitations of how small images may be reduced onto a wafer and these limitations bound the minimum dimensions of the semiconductor device. Some examples of the minimum dimensions for the semiconductor device are minimum gate length, structure width, or pitch between structures.

Various types of lithography systems, such as proximity lithography, contact lithography, projection lithography, or immersion lithography, have been used to increase density in a semiconductor device. Each has their advantages and drawbacks but all have minimum dimension limitations as discussed above.

Lithography systems use a light source to transfer an image from a mask to a wafer. Different light sources, such as a ultra-violet light of different wavelengths, different mask technologies, or both to improve the density in a semiconductor device. Again, each approach has their advantages and drawbacks but all have minimum dimension limitations as discussed above.

Other approaches use different combinations of the above components of a lithography system as well as different types of materials during the manufacture of a wafer. Yet other approaches use these various components in different manufacturing processes to improve density.

For example, semiconductor manufacturing may use a light source emitting light having a 193 nm wavelength to transfer the transform patterns to the wafer. As feature size decreases, the lithographic patterns approach its resolution limit. To extend the use of a lithography system, such as 193 nm lithography system, below its resolution limit, a double exposure technique is considered. The double exposure technique generates a pattern by decomposing one mask layer to two layers and two consecutive exposures forming the desire etch pattern. These approaches have their own drawbacks, such as production throughput impact.

Thus, a need still remains for a method for manufacture of a semiconductor device providing increased density, improved yields, improved throughput, lower cost, and increased use of existing manufacturing equipments. In view of the ever-increasing need to save costs and improve efficiencies, it is increasingly critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a method for forming a semiconductor device including processing a wafer having a target material; forming a first pattern over the target material; forming a protection layer over the first pattern; and forming a second pattern, over the target material and not over the protection layer, without an etching step between the forming the first pattern and the forming the second pattern.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
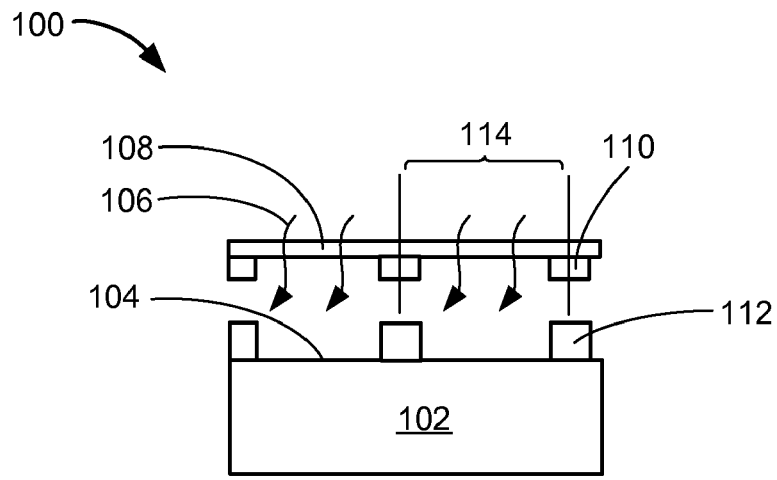
FIG. 1 is a cross-sectional view of a portion of a wafer in a first exposure phase in an embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention. Likewise, the drawings showing embodiments of the system are semi-diagrammatic and not to scale and, particularly, some of the dimensions are for the clarity of presentation and are shown greatly exaggerated in the drawing figures. In addition, where multiple embodiments are disclosed and described having some features in common, for clarity and ease of illustration, description, and comprehension thereof, similar and like features one to another will ordinarily be described with like reference numerals.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

For expository purposes, the term "horizontal" as used herein is defined as a plane parallel to the conventional semiconductor device surface, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements. The term "processing" as used herein includes deposition of material or photoresist, patterning, exposure, development, etching, cleaning, and/or removal of the material or photoresist as required in forming a described structure. The term "system" as used herein means and refers to the method and to the apparatus of the present invention in accordance with the context in which the term is used.

Semiconductor or semiconductor scale device, such as microelectromechanical system, manufacturing typically involves lithography systems (not shown) or also referred to as photolithography systems (not shown). Some examples of lithography systems are proximity lithography, contact lithography, projection lithography, or immersion lithography. The lithography systems use a light source (not shown) to transfer patterns (not shown) from a mask (not shown) onto a semiconductor wafer. The patterns from the mask may include parallel structures or adjacent structures.

The term "pitch" as used herein refers to the separation between the parallel structures or the adjacent structures of the semiconductor wafer transferred by the lithography system used for the manufacture the semiconductor device. The pitch may be measured from side to side of the same side of the adjacent or parallel structures or from the centers of the adjacent or parallel structures. The term "minimum pitch" as used herein refers to the minimum pitch value that may be achieved by the lithography system used for the manufacture the semiconductor device.

Referring now to FIG. 1, therein is a cross-sectional view of a portion of a wafer 100 in a first exposure phase in an embodiment of the present invention. The first exposure phase is the first exposure step described and is not necessarily the first exposure step in the manufacture process of the wafer 100.

A target material 102, such as a semiconductor wafer or a microelectromechanical system wafer, of the portion of the wafer 100 undergoes the first exposure phase. The target material 102 may represent the wafer 100 at different levels, such as towards the beginning, middle, or end, of the manufacturing process of the wafer 100. For illustrative purposes, the target material 102 is shown as a uniform structure, although it is understood that the target material may be a structure that is not uniform, such as having a gradient of materials or multiple layers of materials.

The first exposure phase has a pattern material, such as a positive photoresist or a negative photoresist, on an active side 104 of the wafer 100. The pattern material may be applied on the active side 104 by a number of available processes, such as spin coat and soft bake. Portions of the pattern material may be exposed to a light 106, such as an ultraviolet light. A light source (not shown) of a photolithography system (not shown) emits the light 106 for the manufacture of the wafer 100.

The pattern material may be light sensitive and depending on the type of material, the exposure to the light may harden or soften the portion of the pattern material exposed to the light 106. For example, a mask 108 has a mask pattern 110. The mask 108 blocks the light 106 with the mask pattern 110 and allows the light 106 to pass at locations without the mask pattern 110.

As in this example, the pattern material may be a positive photoresist such that the portion of the pattern material exposed to the light becomes soften. The exposed portion of the pattern material may be removed by a number of available processes, such as a chemical dissolving process, leaving a first pattern 112 from the remaining portion of the pattern material on the wafer 100 not exposed to the light 106. For illustrative purposes, the first pattern 112 is shown as a single layer, although it is understood that the first pattern 112 may be multiple layers.

Structures of the first pattern 112 is be separated by a first pitch 114. The first pitch 114 may be greater than the minimum pitch or substantially the same as the minimum pitch. Other processes available to one ordinary skilled in the art may be used to form the first pattern 112 resulting in the value of the first pitch 114 in a range about minimum pitch to half of the minimum pitch.

Figure 2:
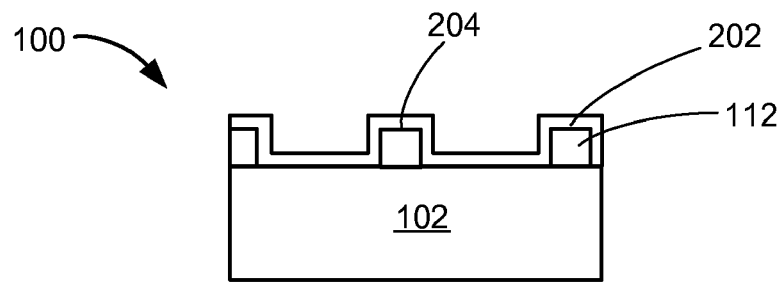
FIG. 2 is the structure of FIG. 1 in a surface treatment phase.

Referring now to FIG. 2, therein is shown the structure of FIG. 1 in a surface treatment phase. A treatment material 202, such as a chemical shrink material, a resist enhancement lithography assisted by chemical shrink (RELACS) material, a shrink assisted film for enhanced resolution (SAFIER), or a precursor film, is applied over the first pattern 112 and the target material 102.

The treatment material 202 may be coated using a number of available processes, such as spin coating. For illustrative purposes, the treatment material 202 is shown as a conformal layer over the first pattern 112 and the wafer 100, although it is understood that the treatment material 202 may fill the space between the first pattern 112. Also for illustrative purposes, the treatment material 202 is shown as a single layer, although it is understood that the treatment material 202 may be more than one layer. Further for illustrative purposes, the treatment material 202 is described as one material, although it is understood that the treatment material 202 may be a gradient or multiple layers of different materials.

The treatment material 202 reacts with the pattern material of the first pattern 112 without dissolving the first pattern 112. The chemical reaction, such as a chemical cross-linking reaction, between the first pattern 112 and the treatment material 202 may be promoted or controlled with an optional heat treatment.

An interface 204 is formed between the surface of the first pattern 112 and the treatment material 202 by the cross linking reaction. For example, the cross linking reaction may have an acid of the first pattern 112 diffuse into the treatment material 202 resulting in the interface 204. The interface 204 may also reduce the space between the first pattern 112.

Figure 3:
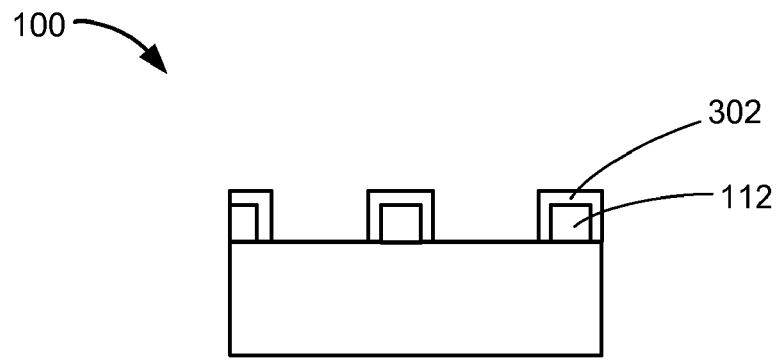
FIG. 3 is the structure of FIG. 2 in a pattern protection phase.

Referring now to FIG. 3, therein is shown the structure of FIG. 2 in a pattern protection phase. The treatment material 202 from the structure of FIG. 2 that did not react with the first pattern 112 may be removed by a number of available cleaning processes, such as spin cleaning with a tetramethylammonium hydroxide (TMAH) solution. This cleaning process removes the unreacted portion of the treatment material 202 leaving a protection layer 302, such as an insoluble protective layer, over the first pattern 112. The protection layer 302 is also along the sides of the first pattern 112 effectively reducing the space between the first pattern 112. The wafer 100 is shown exposed between the first pattern 112 and the protection layer 302.

The protection layer 302 provides good etching durability and mitigates pattern profile degradation of the first pattern 112. Etching durability of the protection layer 302 will be discussed further in FIG. 4.

The protection layer 302 protects the first pattern 112 over the wafer 100 during cleaning process. For example, a process of cleaning the wafer 100 may be performed by spraying deionized water from a top portion of spin device with the wafer 100 spinning. This cleaning process generates high surface tension of deionized water on the first pattern 112 may result in pattern collapse without the protection layer 302.

Figure 4:
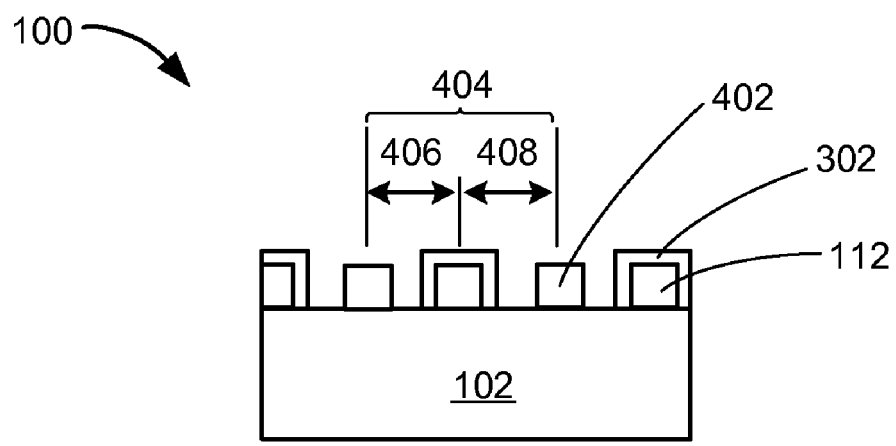
FIG. 4 is the structure of FIG. 3 in a second exposure phase.

Referring now to FIG. 4, therein is shown the structure of FIG. 3 in a second exposure phase. The second exposure may utilize the mask 108 of FIG. 1 that is physically shifted to achieve a pitch that is a fraction of the minimum pitch or may use a different mask (not shown).

A second pattern 402 may be formed as structures between the first pattern 112 and the protection layer 302. The second pattern 402 may be formed by a similar process to the first exposure phase. The mask 108 may be shifted in the second exposure phase from the first exposure phase such that the pitch between the first pattern 112 and the second pattern 402 may be less than the minimum pitch. For illustrative purposes, the second pattern 402 is shown as a single layer, although it is understood that the second pattern 402 may be multiple layers.

Structures of the second pattern 402 are separated by a second pitch 404. The second pitch 404 may be greater than the minimum pitch or substantially the same as the minimum pitch. The structures of the first pattern 112 and the structures of the second pattern 402 may be separated by a third pitch 406, such as a fraction of the minimum pitch, resulting form the double patterning. The structures of the first pattern 112 and the structures of the second pattern 402 may also be separated by a fourth pitch 408, such as a fraction of the minimum pitch, resulting form the double patterning asymmetric placement of the second pattern 402 with the first pattern 112.

Other processes available to one ordinary skilled in the art may be used to form the second pattern 402 resulting in the value of the second pitch 404 in a range about minimum pitch to half of the minimum pitch.

The protection layer 302 provides protection to the first pattern 112 in the second exposure phase. A material of the second pattern 402 may be negative photoresist or positive photoresist. The target material 102 may undergo etching forming the structures in the target material 102. The etching durability of the protection layer 302 should be equal or better than the material of the second pattern 402 such that the structures may be formed with a predetermined resolution and a predetermined feature size.

The treatment material 202 of FIG. 2 or a different type of treatment may be applied over the second pattern 402. This treatment may similarly provide the second pattern 402 improved resistance to pattern collapse and etching durability. The treatment may also reduce the space between the first pattern 112 and the second pattern 402 to form structures (not shown), such as contact holes, with smaller dimensions.

It has been unexpectedly discovered that the application of the chemical shrink material over a first lithographic pattern provides the ability to decrease feature size, such as pitch or size of contact holes, below the features size capability of the lithography system. A second lithographic patterning may be applied with the first pattern protected by the chemical shrink material. An etch process is not performed between the first exposure phase and the second exposure phase resulting in improved throughput of the manufacturing line.

The wafer 100 may be further processed and singulated forming semiconductor dice, integrated circuit dice, or other semiconductor device scale device, such as microelectromechanical system (MEMS). The first pattern 112 and the second pattern 402 may be removed upon the further processing the wafer 100. Other types of devices may also be formed using the present invention, such as optical devices.

Figures 5A, 5B, 5C:
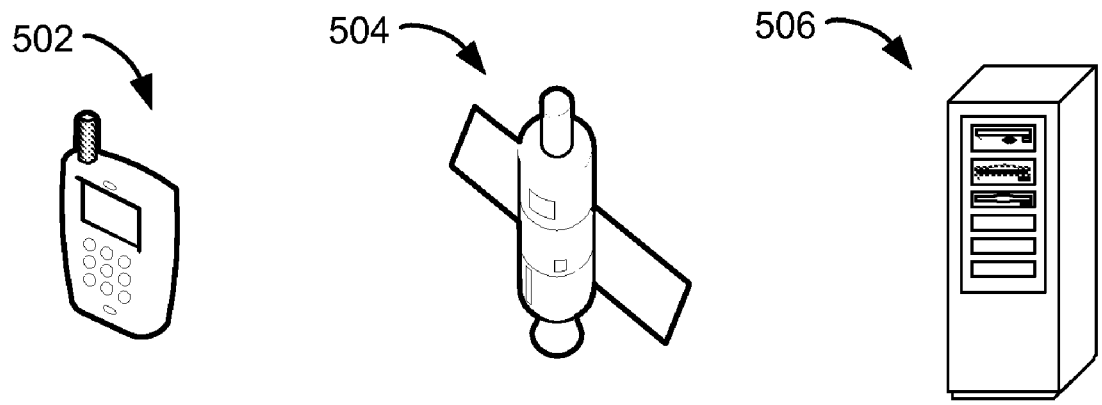
FIGS. 5A, 5B, and 5C are schematic views of examples of electronics systems in which various aspects of the present invention may be implemented.

Referring now to FIGS. 5A, 5B, and 5C, therein are shown schematic views of examples of systems in which various aspects of the present invention may be implemented. A smart phone 502, a satellite 504, and a compute system 506 are examples of the systems using the present invention. The systems may be any system that performs any function for the creation, transportation, storage, and consumption of information. For example, the smart phone 502 may create information by transmitting voice to the satellite 504. The satellite 504 is used to transport the information to the compute system 506. The compute system 506 may be used to store the information. The smart phone 502 may also consume information sent from the satellite 504.

The electronic systems, such as the smart phone 502, the satellite 504, and the compute system 506, include a one or more subsystem, such as a printed circuit board having the present invention or an electronic assembly having the present invention. The electronic system may also include a subsystem, such as an adapter card.

Figure 6:
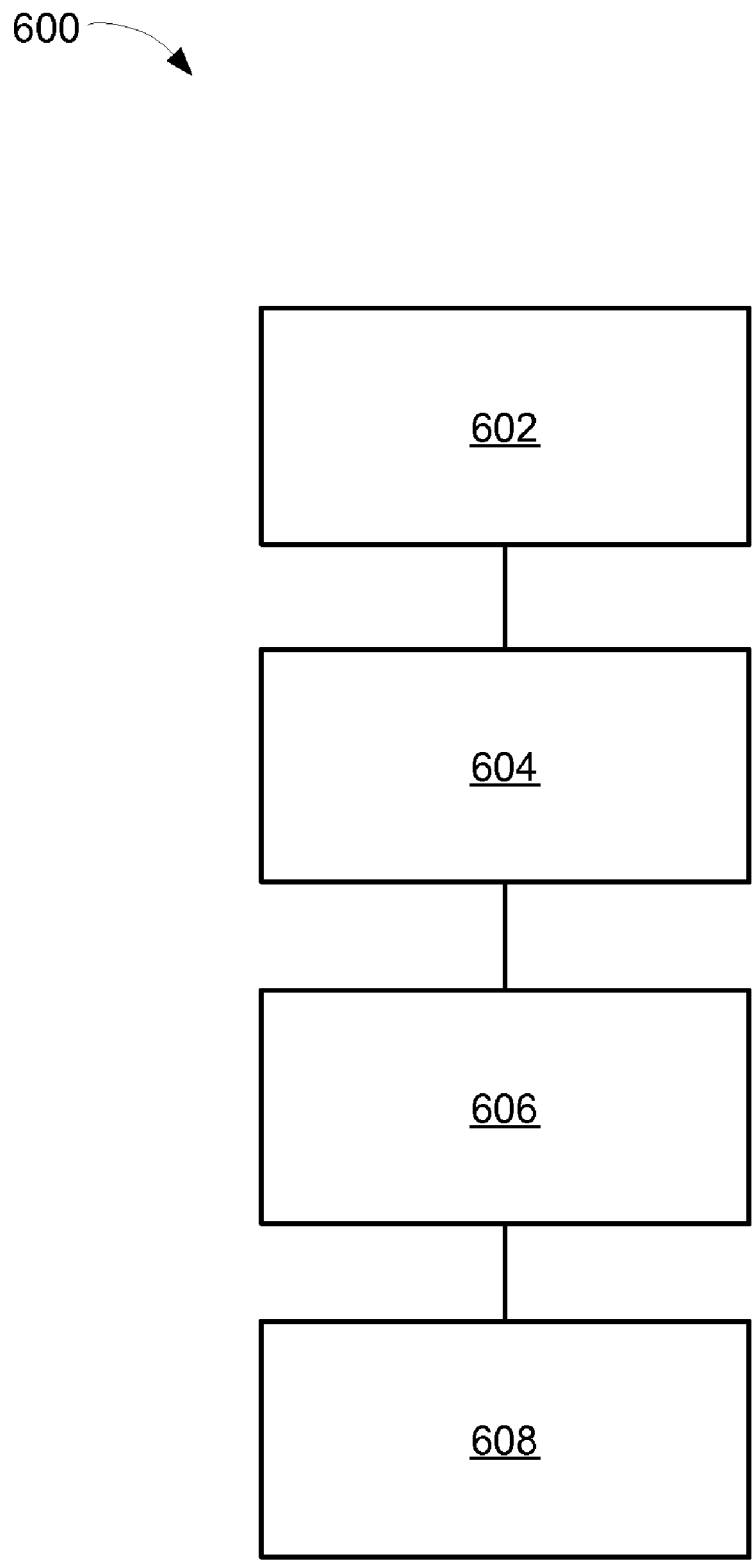
FIG. 6 is a flow chart of a method for manufacture of the semiconductor device in an embodiment of the present invention.

Referring now to FIG. 6, therein is a flow chart of a method 600 for manufacture of the semiconductor device in an embodiment of the present invention. The method 600 includes providing processing a wafer having a target material in a block 602; forming a first pattern over the target material in a block 604; forming a protection layer over the first pattern in a block 606; and forming a second pattern, over the target material and not over the protection layer, without an etching step between the forming the first pattern and the forming the second pattern in a block 608.

In greater detail, a system to form a semiconductor device, in an embodiment of the present invention, is performed as follows:
1. Processing a wafer having a target material. (FIG. 1)
2. Forming a first pattern, comprised of a photoresist, over the target material. (FIG. 1)
3. Forming a protection layer over the first pattern. (FIG. 3)
4. Forming a second pattern comprised of the photoresist, over the target material and not over the protection layer, without an etching step between the forming the first pattern and the forming the second pattern. (FIG. 4)

It has been discovered that the present invention thus has numerous aspects.

A principle aspect of the embodiment that has been discovered is that the present invention increases the output of the manufacturing line processing the wafer and increases densities of structures below the minimum pitch or feature size capability of the lithography system used to manufacture a wafer. The formation of a protection layer over a first lithographic pattern provides the ability for forming a second lithographic pattern, wherein the pitch between the first pattern and the second pattern is a fraction of the minimum pitch.

Another aspect is that the embodiment provides double patterning capability without an etch step between multiple exposures resulting in improved throughput of the manufacturing line.

Yet another aspect is that the present invention provides structures, such as contacts or lines, having the pitch that is a fraction of the minimum pitch or other feature sizes that are a fraction of the feature sizes of the lithography system capability.

Yet another aspect is that the embodiment provides the surface treatment of the patterned photoresist with a chemical shrink material may be performed in any layer of the wafer processing and multiple times.

Yet another aspect is that the embodiment may be performed with layers having different materials, such as electrically conductive or electrically nonconductive, to increase density of circuits, routing in redistribution layers, spacers, or MEMS elements.

Yet another aspect is that the embodiment provides the method for the manufacture of devices of different structures of varying sizes, configurations, and stacking options.

Yet another aspect is that the embodiment provides reuse of existing and mature lithography systems while providing increased integration and density.

Yet another important aspect of the embodiment is that it valuably supports and services the historical trend of reducing costs, simplifying systems, and increasing performance.

These and other valuable aspects of the embodiment consequently further the state of the technology to at least the next level.

Thus, it has been discovered that the semiconductor system of the present invention furnishes important and heretofore unknown and unavailable solutions, capabilities, and functional aspects for increased throughput, increased density, improved yield, and lowered cost. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method for forming a semiconductor device comprising:
   processing a wafer having a target material;
   forming a first pattern using a lithographic process over the target material;
   forming a protection layer over the first pattern;
   forming a second pattern using a process similar to the lithographic process, over the target material and not over the protection layer, without an etching step between the forming the first pattern and the forming the second pattern;
   said protection layer protecting said first pattern during forming of said second pattern.

2. The method as claimed in claim 1 wherein forming the protection layer over the first pattern includes forming the protection layer comprised of a chemical shrink material.

3. The method as claimed in claim 1 wherein forming the protection layer over the first pattern includes forming a conformal layer over the first pattern.

4. The method as claimed in claim 1 wherein forming the protection layer over the first pattern includes:
   coating a treatment material over the target material and the first pattern;
   forming an interface between a surface of the first pattern and the treatment material;
   and forming the protection layer by removing the treatment material not part of the interface.

5. The method as claimed in claim 1 further comprising:
   singulating the semiconductor device from the wafer; and
   forming a system with the semiconductor device.

6. The method as claimed in claim 1 wherein forming the first pattern over the target material includes forming the first pattern having a first pitch.

7. The method as claimed in claim 1 wherein forming the second pattern over the target material includes forming the second pattern having a second pitch.

8. The method as claimed in claim 1 wherein forming the second pattern over the target material includes forming the second pattern between the first pattern with a third pitch between the first pattern and the second pattern.

9. The method as claimed in claim 1 wherein forming the second pattern over the target material includes forming the second pattern asymmetrically spaced between the first pattern with a third pitch and a fourth pitch between the first pattern and the second pattern.

10. The method as claimed in claim 1 wherein forming the second pattern over the target material includes:
    forming the second pattern asymmetrically spaced between the first pattern with a third pitch having a value that is a fraction of a minimum pitch; and
    forming the second pattern asymmetrically spaced between the first pattern with a fourth pitch having a value that is a fraction of the minimum pitch.

11. A method for forming a semiconductor device comprising:
    processing a wafer having a target material;
    forming a first pattern, comprised of a photoresist, over the target material;
    forming a protection layer over the first pattern;
    forming a second pattern comprised of another photoresist, over the target material and not over the protection layer, without an etching step between the forming the first pattern and the forming the second pattern;
    said protection layer protecting said first pattern during forming of said second pattern.

12. The method as claimed in claim 11 wherein forming the protection layer over the first pattern includes:
    coating a treatment material over the target material and the first pattern;
    heating the first pattern and the treatment material;
    forming an interface between a surface of the first pattern and the treatment material; and
    forming the protection layer by removing the treatment material not part of the interface.

13. The method as claimed in claim 11 wherein processing the wafer having the target material includes processing the wafer having the target material for an integrated circuit.

14. The method as claimed in claim 11 wherein processing the wafer having the target material includes processing the wafer having the target material for a microelectromechanical system.

15. The method as claimed in claim 11 wherein processing the wafer having the target material includes processing the wafer having the target material for an optical device.

16. The method as claimed in claim 11 further comprising etching the target material exposed between the first pattern and the second pattern.

17. The method as claimed in claim 11 wherein forming the first pattern, comprised of the photoresist, includes forming the first pattern with a single layer of photoresist.

18. The method as claimed in claim 11 wherein forming the first pattern, comprised of the photoresist, includes forming the first pattern with multiple layers of photoresist.

19. The method as claimed in claim 11 wherein forming the second pattern, comprised of the another photoresist, includes forming the second pattern with a single layer of photoresist.

20. The method as claimed in claim 11 wherein forming the second pattern, comprised of the another photoresist, includes forming the second pattern with multiple layers of photoresist.

\* \* \* \* \*